United States Patent
Seo et al.

(10) Patent No.: US 9,282,685 B2
(45) Date of Patent: Mar. 8, 2016

(54) POWER CONVERSION DEVICE

(71) Applicants: Yusuke Seo, Kasugai (JP); Yutaka Hotta, Chiryu (JP)

(72) Inventors: Yusuke Seo, Kasugai (JP); Yutaka Hotta, Chiryu (JP)

(73) Assignees: Toyota Jidosha Kabushiki Kaisha, Toyota-shi, Aichi-ken (JP); Aisin AW CO., LTD., Anjo-shi, Aichi-ken (JP)

( * ) Notice: Subject to any disclaimer, the term of this patent is extended or adjusted under 35 U.S.C. 154(b) by 47 days.

(21) Appl. No.: 14/373,081

(22) PCT Filed: Jan. 7, 2013

(86) PCT No.: PCT/IB2013/000015
§ 371 (c)(1),
(2) Date: Jul. 18, 2014

(87) PCT Pub. No.: WO2013/110988
PCT Pub. Date: Aug. 1, 2013

(65) Prior Publication Data
US 2015/0245534 A1 Aug. 27, 2015

(30) Foreign Application Priority Data
Jan. 23, 2012 (JP) .................. 2012-011550

(51) Int. Cl.
H05K 7/20 (2006.01)
G01R 15/20 (2006.01)
H02G 5/00 (2006.01)
H05K 7/14 (2006.01)

(52) U.S. Cl.
CPC ............ H05K 7/2089 (2013.01); G01R 15/207 (2013.01); H02G 5/00 (2013.01); H05K 7/14 (2013.01)

(58) Field of Classification Search
CPC .......... G01R 15/18; G06F 1/20; H02K 5/225; H02M 7/003; H01L 23/473; H05K 7/20927
See application file for complete search history.

(56) References Cited

U.S. PATENT DOCUMENTS

| 6,426,617 | B1 | 7/2002 | Haensgen et al. | |
|---|---|---|---|---|
| 8,422,222 | B2 * | 4/2013 | Noda .................. | H05K 7/1432 361/689 |
| 8,493,762 | B2 * | 7/2013 | Ninomiya ............ | H01L 25/112 361/715 |
| 8,531,840 | B2 * | 9/2013 | Tachibana ............ | H02M 7/003 361/688 |
| 8,810,235 | B2 * | 8/2014 | Ueno ................... | G01R 15/207 324/117 H |
| 9,030,822 | B2 * | 5/2015 | Sharaf ................ | H05K 7/20927 165/104.33 |
| 2004/0251928 | A1 | 12/2004 | Taguchi et al. | |

(Continued)

FOREIGN PATENT DOCUMENTS

| JP | 7-35784 | 2/1995 |
|---|---|---|
| JP | 11-121067 | 4/1999 |

(Continued)

*Primary Examiner* — Robert J Hoffberg
*Assistant Examiner* — Hung Dang
(74) *Attorney, Agent, or Firm* — Finnegan, Henderson, Farabow, Garrett & Dunner, LLP

(57) ABSTRACT

Flux concentration cores that encircle bus bars are arranged at different heights. When viewed from an extending direction (a Z-direction) of the bus bars, the first flux concentration core and the second flux concentration core that are adjacent to one another partially overlap each other, and the second flux concentration core and the third flux concentration core that are adjacent to each other partially overlap each other. Therefore, the flux concentration cores are able to be arranged around the bus bars even when the spaces between the bus bars are narrow.

5 Claims, 8 Drawing Sheets

(56) References Cited

U.S. PATENT DOCUMENTS

| | | | |
|---|---|---|---|
| 2007/0153438 A1* | 7/2007 | Caggiano | H02B 1/04 361/62 |
| 2008/0186751 A1* | 8/2008 | Tokuyama | H01L 23/473 363/131 |
| 2009/0231811 A1* | 9/2009 | Tokuyama | H01L 23/36 361/699 |
| 2010/0165680 A1* | 7/2010 | Yoshinaga | B60L 11/1803 363/123 |
| 2011/1005022 | 3/2011 | Ueno et al. | |
| 2011/0131793 A1 | 6/2011 | Woodbury | |
| 2012/0063188 A1 | 3/2012 | Hotta et al. | |

FOREIGN PATENT DOCUMENTS

| | | |
|---|---|---|
| JP | 2005-6445 | 1/2005 |
| JP | 2006-194650 | 7/2006 |
| JP | 2007-20238 | 1/2007 |
| JP | 2011-15586 | 1/2011 |
| JP | 2011-53061 | 3/2011 |
| JP | 2011-232086 | 11/2011 |

\* cited by examiner

POWER CONVERSION DEVICE

CROSS-REFERENCE TO RELATED APPLICATIONS

This application is a national phase application of International Application No. PCT/IB2013/000015, filed Jan. 7, 2013, and claims the priority of Japanese Application No.2012-011550, filed Jan. 23, 2012, the content of both which is incorporated herein by reference.

BACKGROUND OF THE INVENTION

1. Field of the Invention

The invention relates to a power conversion device that supplies power from a plurality of bus bars to an electrical device. More particularly, the invention relates to a power conversion device that detects conduction current values of the bus bars.

2. Description of Related Art

For example, three-phase current is supplied from three bus bars to a three-phase motor. When detecting the conduction current values of the bus bars, flux concentration cores 60, 70, and 80 are arranged around bus bars 62, 72, and 82, and magnetic sensors 66, 76, and 86 are arranged in gaps formed in the flux concentration cores, as shown in FIGS. 9A and 9B and described in Japanese Patent Application Publication No. 2011-053061 (JP 2011-053061 A).

When arranging the flux concentration cores around the bus bars, the spaces between bus bars need to be wide. For example, there must be enough space between the first bus bar 62 and the second bus bar 72 for both the first flux concentration core 60 that encircles the first bus bar 62 (or more accurately, that has a first end portion and a second end portion and encircles the first bus bar 62 with the first end portion facing the second end portion across gap 64) and the second flux concentration core 70 that encircles the second bus bar 72 (or more accurately, that has a first end portion and a second end portion and encircles the second bus bar 72 with the first end portion facing the second end portion across gap 74) to be able to pass through. The same is also true for the space between the second bus bar 72 and the third bus bar 82. However, if the spaces between the bus bars are wide, the sectional area of the space required for the bus bar group to pass through will be large, and a case in which the power conversion device is housed and the like will end up being large.

SUMMARY OF THE INVENTION

The invention provides a power conversion device in which a space between bus bars is able to be narrow. A first aspect of the invention relates to a power conversion device that includes a plurality of bus bars including a first bus bar and a second bus bar that are adjacent to each other, and that extend parallel to each other; a first flux concentration core that has a first end portion and a second end portion and encircles the first bus bar with the first end portion facing the second end portion across a gap, and a second flux concentration core that has a first end portion and a second end portion and encircles the second bus bar with the first end portion facing the second end portion across a gap; and a first magnetic sensor that is arranged in the gap of the first flux concentration core, and a second magnetic sensor that is arranged in the gap of the second flux concentration core. Because there is a plurality of bus bars, there is also a plurality of flux concentration cores, as well as a plurality of magnetic sensors. When the power conversion device is viewed from a direction orthogonal to an extending direction of the bus bars, a position in the extending direction where the first flux concentration core is arranged is different than a position in the extending direction where the second flux concentration core is arranged. Also, when viewed from the extending direction of the bus bars, the first flux concentration core and the second flux concentration core partially overlap with each other. The power conversion device of the invention is not limited to a flux concentration core and a magnetic sensor being arranged on all of the bus bars. For example, with three-phase alternating current, if the current values of two phases are detected, the current value of the remaining phase can be calculated. The power conversion device of this invention is not limited to a flux concentration core being arranged on all of the bus bars. That is, the invention may also be applied to a case in which a flux concentration core is not arranged on a portion (i.e., one or some) of the bus bars.

Hereinafter, the position in the extending direction of the bus bar will be referred to as the height. In the power conversion device described above, the heights at which the flux concentration cores are arranged are different depending on the bus bar, so adjacent flux concentration cores partially overlap when viewed from the extending direction of the bus bars. By offsetting the heights at which adjacent flux concentration cores are arranged, two flux concentration cores are able to pass through a space between the bus bars even if that space (i.e., the space between the bus bars) is narrow. In a power conversion device that detects the conduction current value of each of the bus bars, the space between bus bars is able to be made narrow, so the power conversion device is able to be made smaller. The power conversion device described above is useful when two or more bus bars extend parallel to one another.

When two or more bus bars that extend parallel to one another are arranged in order, the structure may be as described below when viewing the two adjacently arranged bus bars. The flux concentration core that is arranged around the first bus bar may be the first flux concentration core, the gap in the first flux concentration core may be a first gap, and the magnetic sensor that is arranged in the first gap may be the first magnetic sensor. The flux concentration core that is arranged around the second bus bar may be the second flux concentration core, the gap in the second flux concentration core may be a second gap, and the magnetic sensor that is arranged in the second gap may be the second magnetic sensor. In this case, the first gap and the second gap may be arranged within the same plane, and the first magnetic sensor and the second magnetic sensor may be mounted on a common circuit board. The first magnetic sensor may be arranged on the second flux concentration core side in the extending direction of the first bus bar in the first gap, when viewed from a direction orthogonal to the extending direction of the first bus bar and orthogonal to a width direction of the first bus bar, and the second magnetic sensor may be arranged on the first flux concentration core side in the extending direction of the second bus bar in the second gap, when viewed from a direction orthogonal to the extending direction of the second bus bar and orthogonal to a width direction of the second bus bar.

The description above illustrates a case in which two adjacently arranged bus bars are selected and viewed. The invention may also be applied to a case in which three or more bus bars are arranged parallel to each other. For example, when first, second, and third bus bars are arranged in order, a positional relationship may be discernible between the first bus bar and the second bus bar, and a positional relationship may be discernible between the second bus bar and the third bus bar. In this case, a first gap, a second gap, and a third gap may be arranged within the same plane, and a first magnetic sensor, a second magnetic sensor, and a third magnetic sensor may be mounted on a common circuit board. When viewed from a direction orthogonal to the extending direction of the bus bars and orthogonal to the width direction of the bus bars, the first magnetic sensor may be arranged on the second flux concentration core side in the first gap, the second magnetic sensor may be arranged on the first flux concentration core side in the second gap, and the third magnetic sensor may be arranged on the second flux concentration side in the third gap.

The first magnetic sensor and the second magnetic sensor may have the same specifications. Also, the first magnetic sensor may include a first magnetic sensory portion, and the second magnetic sensor may include a second magnetic sensory portion. The first magnetic sensory portion may be provided on the first flux concentration core side of the first magnetic sensor, when viewed from the direction orthogonal to the extending direction of the first bus bar and orthogonal to the width direction of the first bus bar. The second magnetic sensory portion may be provided on the second flux concentration core side of the second magnetic sensor, when viewed from the direction orthogonal to the extending direction of the second bus bar and orthogonal to the width direction of the second bus bar. In this case, the first magnetic sensor and the second magnetic sensor are able to be mounted on a common circuit board. Also, the length in the extending direction (i.e., the length in the height direction) is able to be short. Thus, a power conversion device provided with a plurality of bus bars is able to be made even smaller.

Magnetic sensors having the same specifications may also be used when a first magnetic sensor, a second magnetic sensor, and a third magnetic sensor are used on first, second, and third bus bars that are arranged in parallel. Also, each of these magnetic sensors having the same specifications may be provided with a magnetic sensory portion in a position closer to one side of an outer shape of the sensor. In this case, the first magnetic sensor and the second magnetic sensor are arranged facing opposite directions, and the second magnetic sensor and the third magnetic sensor are arranged facing opposite directions. That is, the first magnetic sensor and the third magnetic sensor are arranged facing the same direction. With this structure as well, the length in the extending direction (i.e., the length in the height direction) of the circuit board on which the magnetic sensors are mounted is able to be made even shorter.

When a first bus bar, a second bus bar, and a third bus bar are arranged extending parallel to each other, a position of the first flux concentration core in the extending direction and a position of the third flux concentration core in the extending direction may be equivalent, while a position of the second flux concentration core in the extending direction may be offset with respect to the position of the first flux concentration core in the extending direction and the position of the third flux concentration core in the extending direction, when viewed from the direction orthogonal to the extending direction of the bus bars and orthogonal to the width direction of the bus bars, and the first flux concentration core and the second flux concentration core may partially overlap with each other and the second flux concentration core and the third flux concentration core may partially overlap with each other, when viewed from the extending direction of the bus bars. In this case as well, the spaces between adjacent bus bars are able to be made narrow, so a power conversion device provided with three bus bars can be made smaller.

The plurality of bus bars may include a first bus bar group that is a set of three bus bars for three-phase alternating current, and a second bus bar group that a set of three bus bars for three-phase alternating current, and the six bus bars of the first bus bar group and the second bus bar group may be arranged in line. In this case, the first bus bar group may include the first bus bar, and the second bus bar group may include the second bus bar. In this case, six bus bars are able to be arranged in line with narrow spaces therebetween.

The power conversion device needs to be connected to an electrical device. Therefore, a terminal may be fixed to one end of each of the bus bars, and a terminal block to which a plurality of terminal groups corresponding to a plurality of bus bars is fixed arranged in line may be provided. The invention may also be applied to a case in which a flux concentration core group is arranged adjacent to the terminal block. Applying the invention makes it possible to arrange a plurality of terminals in line, with narrow spaces therebetween. The flux concentration core group and the terminal block may be said to be arranged adjacent to one another when no other member is arranged between the flux concentration core group and the terminal block. Even if another member is arranged between the flux concentration core group and the terminal block, as long as that member is small, the flux concentration core group and the terminal block may still be said to be arranged adjacent to each other.

The plurality of bus bars, the plurality of flux concentration cores, the plurality of terminals, and the terminal block may be housed in a case. In this case, the plurality of terminals that are fixed to the terminal block are fixed in positions facing an opening formed in the case. Accordingly, a connector becomes fixed to the case when connector passes through the opening and is connected to the terminals. When the invention is applied to this power conversion device, the spaces between the terminals on the terminal block can be made narrower, so the width of the opening can be reduced, and thus the width of the connector can be reduced.

According to the power conversion device of the invention, the conduction current value of each bus bar can be detected while the spaces between bus bars are made narrow. Thus, a power conversion device that needs to detect the conduction current value of each bus bar can be made smaller.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The main characteristics of example embodiments described below will now be listed.

(Characteristic 1) Three-phase current is supplied to a three-phase motor using three bus bars.

(Characteristic 2) The power conversion device forms part of a circuit that supplies power from an onboard battery to an onboard motor.

(Characteristic 3) A first flux concentration core and a second flux concentration core are stacked together with a magnetic insulating plate interposed therebetween.

(Characteristic 4) The second flux concentration core and a third flux concentration core are stacked together with a magnetic insulating plate interposed therebetween.

(Characteristic 5) A flux concentration core and a magnetic sensor are arranged on all of the three bus bars for the three phases. The bus bar group is a three-phase single system in which one flux concentration core and one magnetic sensor are arranged on each bus bar.

(Characteristic 6) Two sets of three-phase single systems are arranged in line.

(Characteristic 7) A flux concentration core and a magnetic sensor are arranged on two of the three bus bars for the three phases. The bus bar group is a two-phase double system in which one flux concentration core and two magnetic sensors are arranged on each bus bar.

Figure 1:
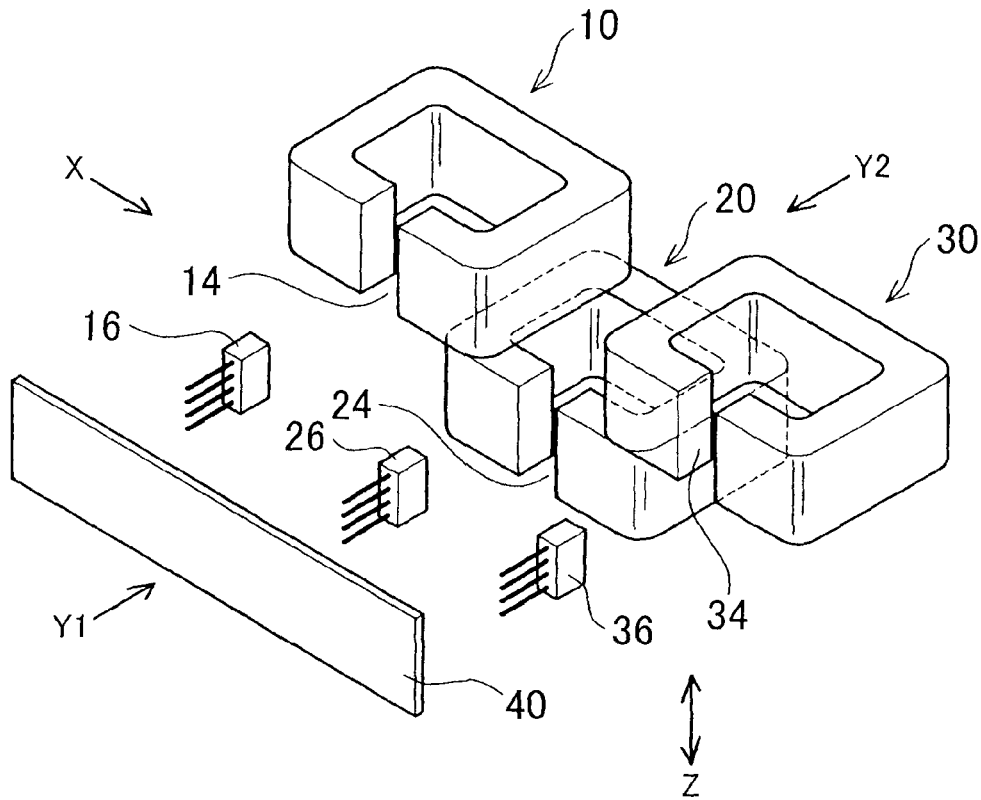
FIG. 1 is a view of the arrangement of a first flux concentration core, a second flux concentration core, and a third flux concentration core of a power conversion device according to a first example embodiment of the invention.
Figure 2:
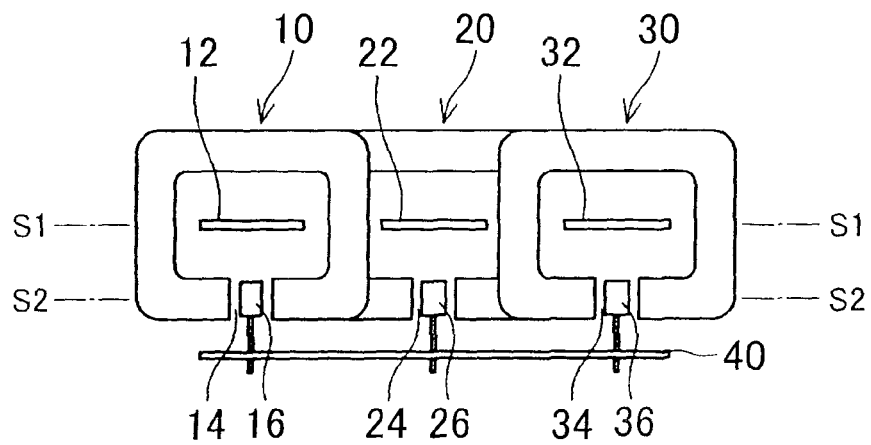
FIG. 2 is a view of the power conversion device of the first example embodiment as viewed from an extending direction of bus bars.

FIG. 1 is a view showing a first magnetic sensor 16 removed from a first gap 14, a second magnetic sensor 26 removed from a second gap 24, and a third magnetic sensor 36 removed from a third gap 34, in order to make the drawings clearer. Also, the first magnetic sensor 16, the second magnetic sensor 26, and the third magnetic sensor 36 are shown detached from a common circuit board 40. Bus bars are not shown in order to make the drawing clearer. FIG. 2 is a view of a portion of a power conversion device according to a first example embodiment as viewed from an extending direction (Z-direction in FIG. 1) of bus bars 12, 22, and 32. The power conversion device 1 includes a first bus bar 12, a second bus bar 22, and a third bus bar 32 that extend parallel to each other and are arranged in order within the same plane S1. A first flux concentration core 10 that encircles the first bus bar 12 (or more accurately, that has a first end portion and a second end portion and encircles the first bus bar 12 with the first end portion facing the second end portion across a gap 14), and the first magnetic sensor 16 that is arranged in the first gap 14 formed in the first flux concentration core 10, are arranged on the first bus bar 12. Similarly, the second flux concentration core 20 that encircles the second bus bar 22 (or more accurately, that has a first end portion and a second end portion and encircles the second bus bar 22 with the first end portion facing the second end portion across a gap 24), and the second magnetic sensor 26 that is arranged in the second gap 24 formed in the second flux concentration core 20, are arranged on the second bus bar 22. Also, the third flux concentration core 30 that encircles the third bus bar 32 (or more accurately, that has a first end portion and a second end portion and encircles the third bus bar 32 with the first end portion facing the second end portion across a gap 34), and the third magnetic sensor 36 that is arranged in the third gap 34 formed in the third flux concentration core 30, are arranged on the third bus bar 32. The first magnetic sensor 16, the second magnetic sensor 26, and the third magnetic sensor 36 are mounted on a common circuit board 40.

Figure 3:
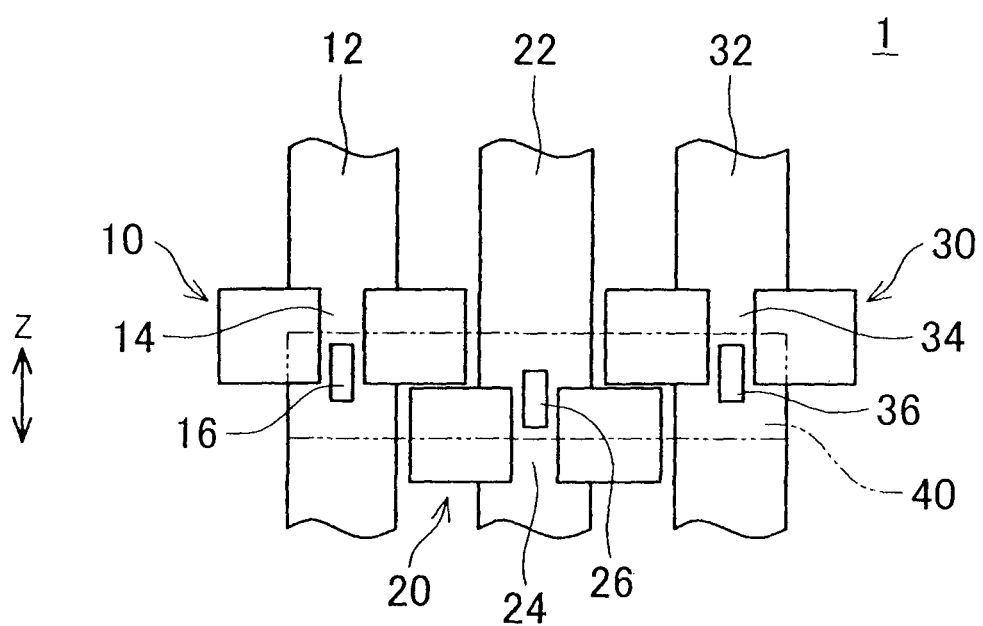
FIG. 3 is a view of the power conversion device of the first example embodiment as viewed from a direction orthogonal to the extending direction of the bus bars.

FIG. 3 is a view of the power conversion device 1 according to the first example embodiment as viewed from a direction (Y1-direction in FIG. 1) orthogonal to the extending direction of the bus bars 12, 22, and 32. In FIG. 3, the common circuit board 40 is shown transparent to make the drawing clearer. When viewed from a direction orthogonal to the extending direction (the Z-direction or the height direction) of the bus bars 12, 22, and 24, the heights of the first flux concentration core 10 and the third flux concentration core 30 are the same, but the height of the second flux concentration core 20 is different. The second flux concentration core 20 is offset in height from the first flux concentration core 10 and the third flux concentration core 30. This offset in height enables the first flux concentration core 10 and the second flux concentration core 20 to be arranged overlapping each other, as well as enables the second flux concentration core 20 and the third flux concentration core 30 to be arranged overlapping each other.

Figure 9A:
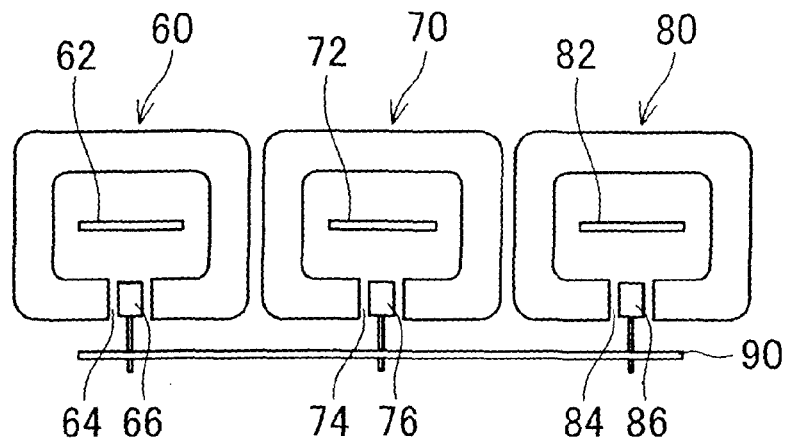
FIG. 9A is a view of a related power conversion device as viewed from the extending direction of bus bars.
Figure 9B:
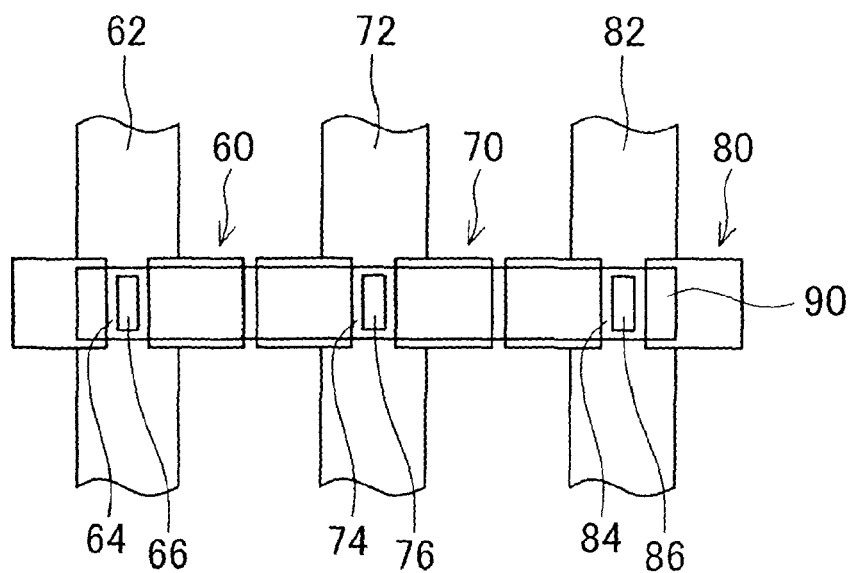
FIG. 9B is a view of the related power conversion device as viewed from a direction orthogonal to the extending direction of the bus bars.

As shown in FIG. 2, when viewed from the extending direction of the bus bars 12, 22, and 32, the first flux concentration core 10 and the second flux concentration core 20 partially overlap each other, and the second flux concentration core 20 and the third flux concentration core 30 partially overlap each other. Because the first flux concentration core 10 and the second flux concentration core 20 partially overlap with each other, the first flux concentration core 10 and the second flux concentration core 20 pass through a space between the first bus bar 12 and the second bus bar 22, even if the space between the first bus bar 12 and the second bus bar 22 is narrow. Similarly, because the second flux concentration core 20 and the third flux concentration core 30 partially overlap with each other, the second flux concentration core 20 and the third flux concentration core 30 pass through a space between the second bus bar 22 and the third bus bar 32, even if the space between the second bus bar 22 and the third bus bar 32 is narrow. Compared with the spaces in FIGS. 9A and 9B, the spaces between the bus bars in FIGS. 2 and 3 are narrow. Therefore, the width of the circuit board 40 (i.e., the width in an X-direction of FIG. 1) is narrower than the width of a circuit board 90 in FIGS. 9A and 9B. The common circuit board 40 is smaller than the circuit board 90.

FIG. 1 is a perspective view of the positional relationships among the first flux concentration core 10, the second flux concentration core 20, and the third flux concentration core 30. In actuality, the first magnetic sensor 16 is arranged in the first gap 14, the second magnetic sensor 26 is arranged in the second gap 24, and the third magnetic sensor 36 is arranged in the third gap 34. Also, the first magnetic sensor 16, the second magnetic sensor 26, and the third magnetic sensor 36 are all mounted on the single common circuit board 40.

As shown in FIG. 2, the first gap 14, the second gap 24, and the third gap 34 are positioned within the same plane S2 that extends parallel to the direction in which the bus bars 12, 22, and 32 extend. Therefore, the first magnetic sensor 16, the second magnetic sensor 26, and the third magnetic sensor 36 that are mounted on the single common circuit board 40 are able to be positioned in the corresponding gaps 14, 24, and 34.

Figure 4A:
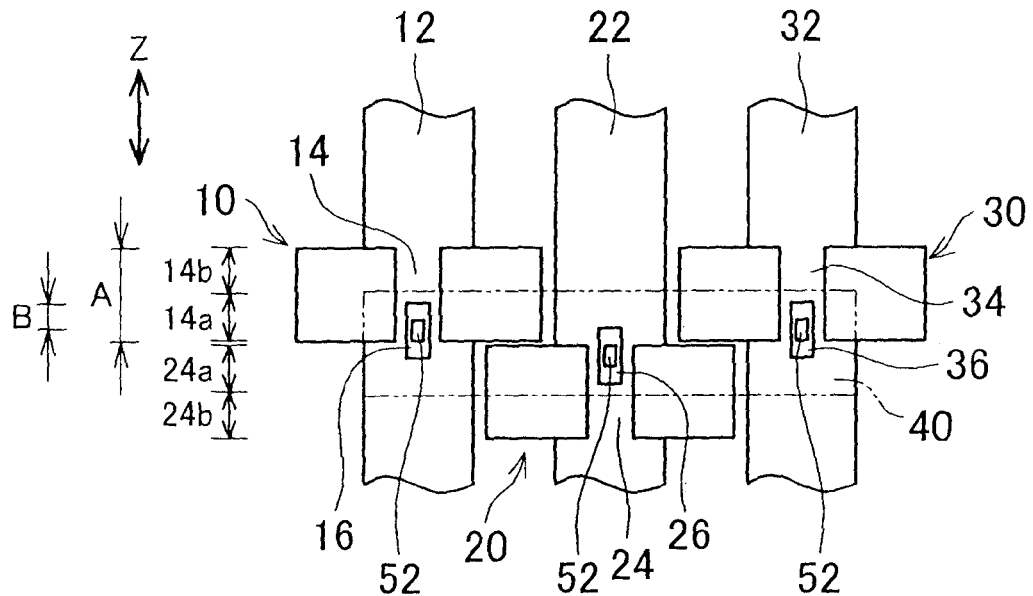
FIGS. 4A to 4C are views showing positional relationships of magnetic sensors, gaps, and magnetic sensory portions according to the first example embodiment of the invention.
Figures 4B, 4C:
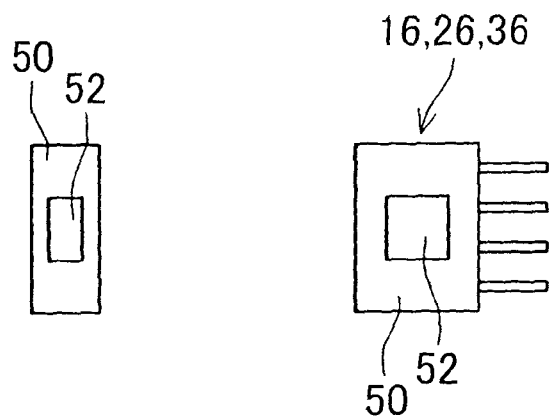

The specifications of the first magnetic sensor 16, the second magnetic sensor 26, and the third magnetic sensor 36 are all the same. FIG. 4C is a view of a common magnetic sensor as viewed from the X-direction in FIG. 1. A magnetic sensory portion 52 is arranged in a center portion in the Z-direction of an outer shape 50 of the magnetic sensor. FIG. 4B is a view of the common magnetic sensor as viewed from a Y2-direction in FIG. 1. As shown in FIG. 4A, the magnetic sensory portion 52 of the first magnetic sensor 16 arranged in the first gap 14 is arranged on the second gap 24 side (in range 14a) within the overall length of the first gap 14 in the Z-direction. The magnetic sensory portion 52 of the second magnetic sensor 26 that is arranged in the second gap 24 is arranged on the first gap 14 side or the third gap 34 side (in range 24a) within the overall length of the second gap 24 in the Z-direction. The magnetic sensory portion 52 of the third magnetic sensor 36 that is arranged in the third gap 34 is arranged on the second gap 24 side within the overall length of the third gap 34 in the Z-direction. Therefore, a difference B in the heights at which the first magnetic sensor 16 and the second magnetic sensor 26 are arranged, and a difference B in the heights at which the second magnetic sensor 26 and the third magnetic sensor 36 are arranged are smaller than a difference A between the heights of the first gap 14 and the second gap 24. As a result, a width in the Z-direction of the circuit board 40 on which the first magnetic sensor 16, the second magnetic sensor 26, and the third magnetic sensor 36 are mounted is short. If the magnetic sensors 16, 26, and 36 were arranged in positions in the middle of the overall length of the gaps 14, 24, and 34 in the Z-direction, the width of the circuit board 40 in the Z-direction would need to be longer than that shown in FIG. 4A. As described above, the circuit board 40 is small in the X-direction as well as in the Z-direction in FIG. 1. When the circuit board is small, the defect rate in the manufacturing process of the circuit board decreases. Also, the circuit board 40 of this example embodiment is small, so the first pass yield at the time of manufacture is high and the circuit board 40 can be manufactured inexpensively.

Figure 5A:
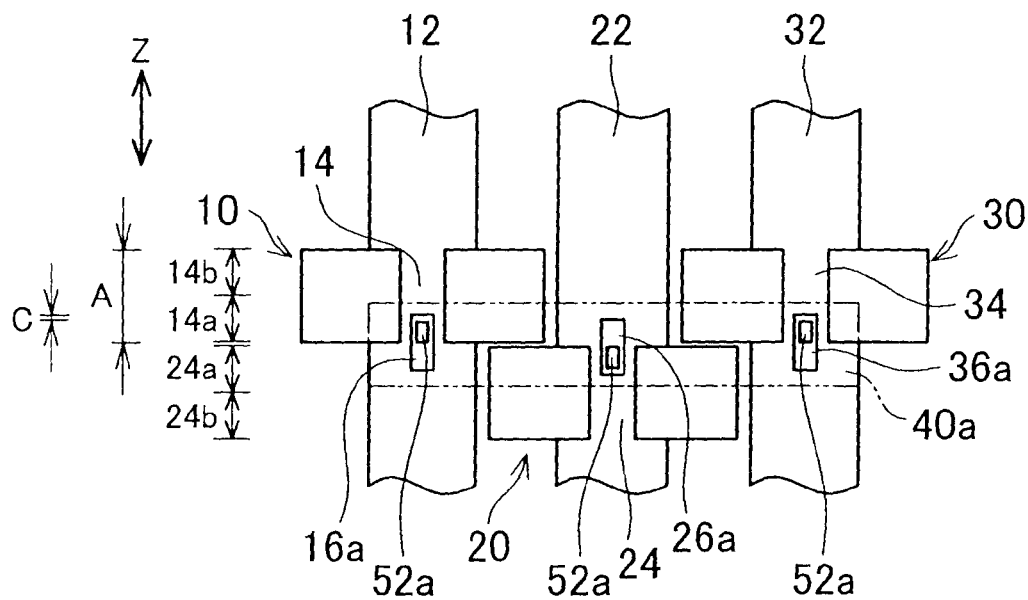
FIGS. 5A to 5C are views showing positional relationships of magnetic sensors, gaps, and magnetic sensory portions according to a second example embodiment of the invention.
Figures 5B, 5C:
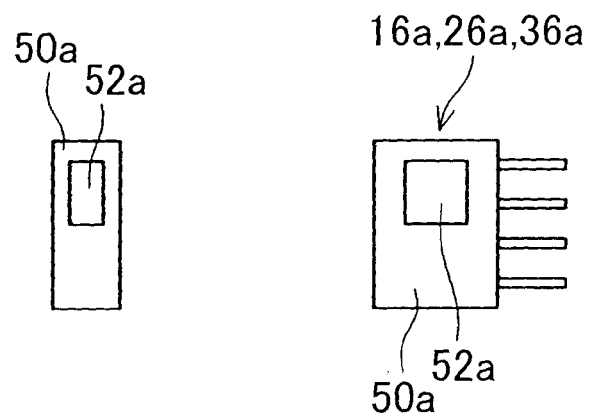

FIGS. 5A to 5C are views of a second example embodiment in which the width of a circuit board 40a in the Z-direction is shorter than the width of the circuit board 40 in the Z-direction in FIGS. 4A to 4C. As shown in FIGS. 5B and 5C, a magnetic sensor used in this example embodiment is offset to one side in the Z-direction with respect to an outer shape 50a of a magnetic sensor. The outer shape 50a of the magnetic sensor is similar to the outer shape 50 of the magnetic sensor in FIG. 4C. In this example embodiment, a first magnetic sensor 16a that is arranged in the first gap 14 is used in an orientation in which a magnetic sensory portion 52a is offset upward in the Z-direction, as shown in FIG. 5A. A third magnetic sensor 36a that is arranged in the third gap 34 is also used in an orientation in which the magnetic sensory portion 52a is offset upward in the Z-direction. In contrast, a second magnetic sensor 26a is flipped vertically. That is, the second magnetic sensor 26a that is arranged in the second gap 24 is used in an orientation in which the magnetic sensory portion 52a is offset downward in the Z-direction. Accordingly, a difference C in the heights at which the first magnetic sensor 16a and the second magnetic sensor 26a are arranged, and a difference C in the heights at which the second magnetic sensor 26a and a third magnetic sensor 36a are able to be kept small. Therefore, the width of the circuit board 40a in the Z-direction is able to be kept narrow. The width of the circuit board 40a in a Z-direction in FIG. 5A is narrower than the width of the circuit board 40 in the Z-direction in FIG. 4A.

In this example embodiment, a magnetic sensor in which a Hall element is arranged on a magnetic sensory portion is used. Alternatively, however, a magnetoresistive element may be used instead of the Hall element. In this example embodiment, in order to minimize the length in the Z-direction, the heights at which the first flux concentration core 10 and the third flux concentration core 30 are arranged are the same. If there is enough length in the Z-direction, the heights of all of the first flux concentration core 10, the second flux concentration core 20, and the third flux concentration core 30 may be changed. In this example embodiment, a case in which three bus bars extend parallel to each other is described, but the power conversion device described in this specification is also effective when two or more bus bars extend parallel to one another, so the invention is not limited to three bus bars.

Figure 6:
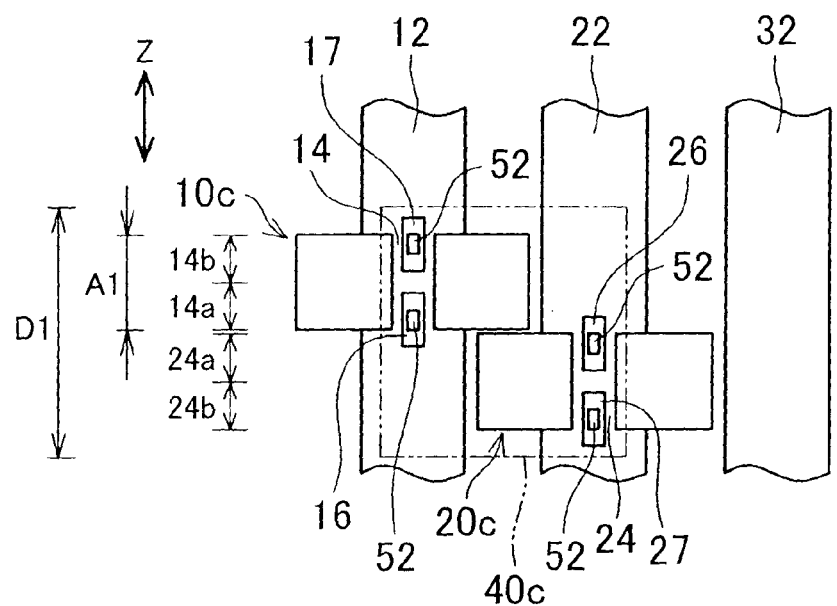
FIG. 6 is a view showing positional relationships of magnetic sensors, gaps, and magnetic sensory portions according to a third example embodiment of the invention.

FIG. 6 is a view of a two-phase double system. That is, when three-phase alternating current is supplied to the bus bars 12, 22, and 32, if the current values of two phases are detected, the current value of the remaining phase is able to be calculated. In this example embodiment, the current values of the bus bars 12 and 22 are detected, and the current value of the bus bar 32 is calculated from these. A power conversion device is not provided on the third bus bar 32. In the double system, two magnetic sensors are arranged in a gap of a flux concentration core. In FIG. 6, when two magnetic sensors are arranged in one gap, e.g., when magnetic sensors 16 and 17 are arranged in a first gap 14 of a first flux concentration core 10c and magnetic sensors 26 and 27 are arranged in a second gap 24 of a second flux concentration core 20c, the current value is able to be calculated even if an abnormality occurs in any one of the magnetic sensors. A double system is provided. In FIG. 6, the magnetic sensor shown in FIGS. 4A to 4C is used.

Figure 7:
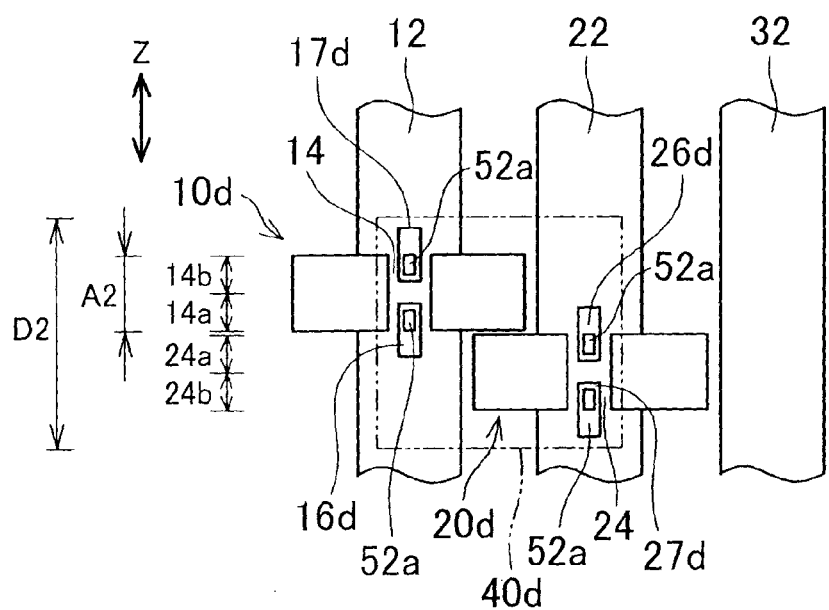
FIG. 7 is a view showing positional relationships of magnetic sensors, gaps, and magnetic sensory portions according to a fourth example embodiment of the invention.

FIG. 7 is also a view of a two-phase double system. In FIG. 7, the magnetic sensor shown in FIGS. 5A to 5C is used. In this case, with a pair of upper and lower magnetic sensory portions 52a, the distance from the upper magnetic sensory portion 52a to the lower magnetic sensory portion 52a, is shorter than the distance in FIG. 6. As a result, a height A2 of a first flux concentration core 10d and a second flux concentration core 20d in the Z-direction is able to be shorter than the height A1 in FIG. 6. Accordingly, a width D2 of a circuit board 40d in the Z-direction is also able to be shorter than the width D1 in FIG. 6.

Figure 10:
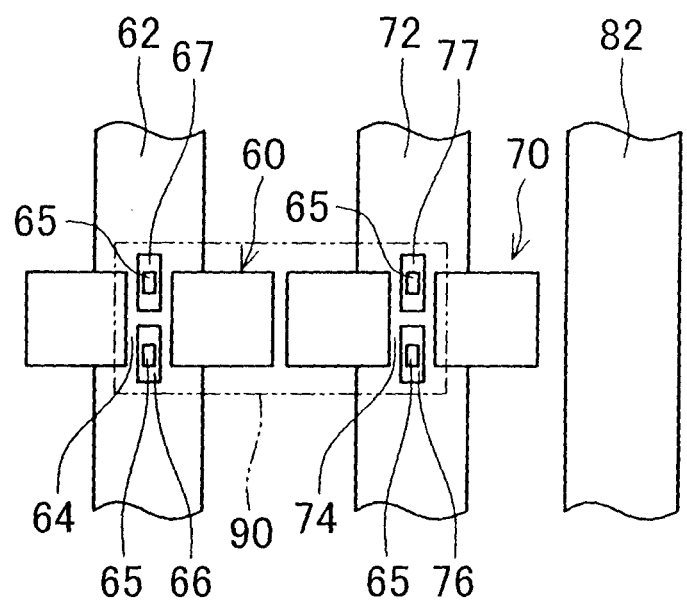
FIG. 10 is a view of another related power conversion device as viewed from a direction orthogonal to the extending direction of the bus bars.

FIG. 10 is a view of an example of a related two-phase double system. Compared with FIGS. 6 and 7, the space between bus bars 62 and 72 that are adjacent to one another must wide. As shown in FIGS. 6 and 7, it is clear that the space between adjacent bus bars 12 and 22 can be made narrower by changing the heights of the flux concentration cores.

Figure 8:
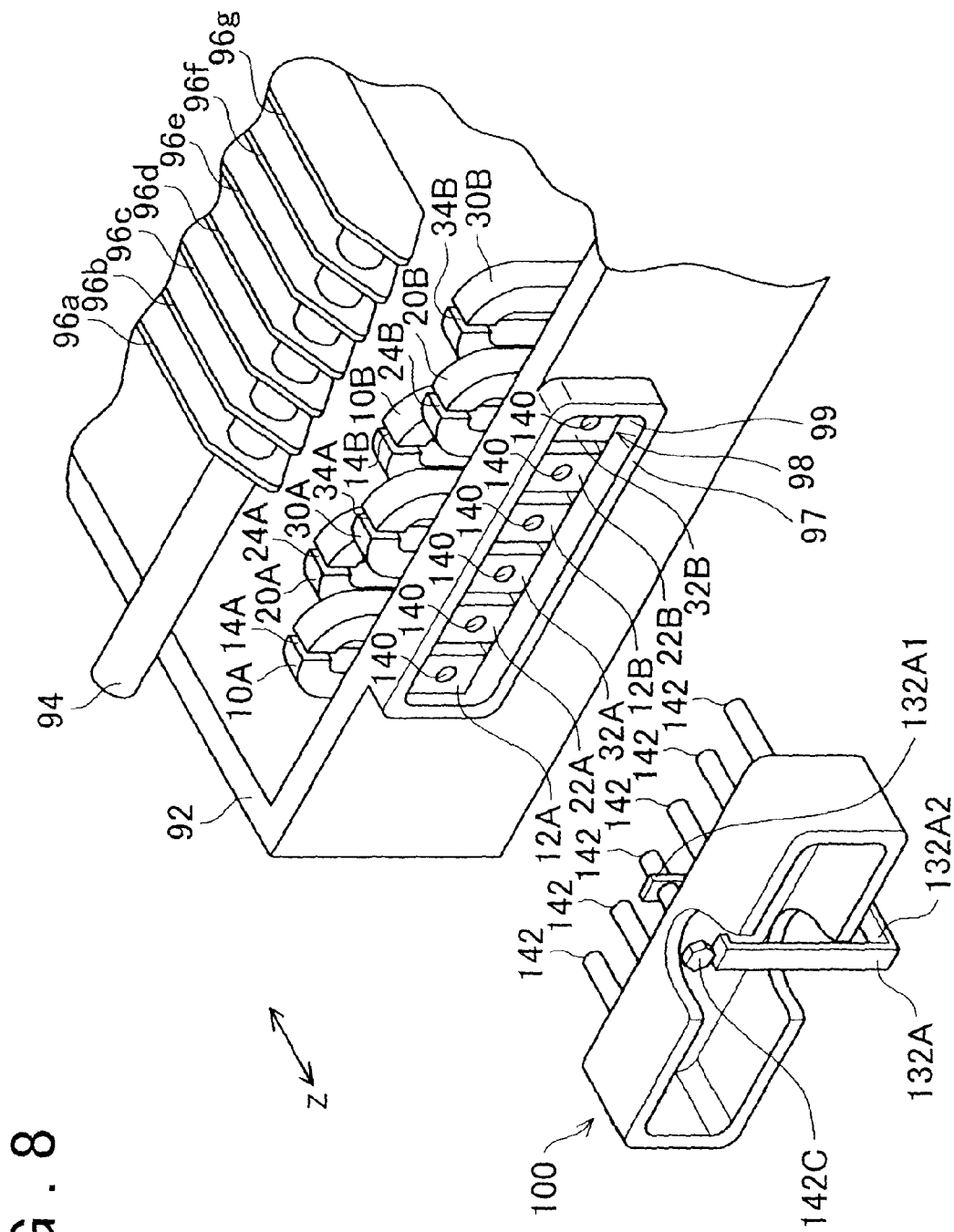
FIG. 8 is a perspective view of a terminal group arranged in line, a terminal block, a flux concentration core group, a case, and an opening.

FIG. 8 is a perspective view showing a state in which a lid that forms a case of the power conversion device 1 is open. Power conversion semiconductor modules, not shown, are sandwiched between adjacent cooling panels 96a to 96g for the power conversion semiconductor modules. As shown in FIG. 8, a coolant inlet pipe 94 is provided, and a coolant outlet pipe is provided in a position that is not shown. Terminals 12A, 22A, and 32A will collectively be referred to as a first terminal group for three-phase current. Terminals 12B, 22B, and 32B will collectively be referred to as a second terminal group for three-phase current. A bus bar extends between each semiconductor module and each terminal, such that a total of six bus bars extend parallel to each other between the semiconductor modules and the terminals. All six bus bars are arranged in line. Each of the terminals 12A, 22A, 32A, 12B, 22B, and 32B is formed by a tip end portion of each of the six bus bars. The six terminals 12A, 22A, 32A, 12B, 22B, and 32B are fixed in line by a terminal block 98. A hole 140 is open in each of the terminals 12A, 22A, 32A, 12B, 22B, and 32B, and a screw hole is open deep in each hole. A screw hole is formed in the terminal block 98.

A flux concentration core is arranged around each of the six bus bars that are arranged in line. Because there are six bus bars, six flux concentration cores 10A, 20A, 30A, 10B, 20B, and 30B are arranged. The six bus bars are arranged with narrow spaces between them because the six flux concentration cores 10A, 20A, 30A, 10B, 20B, and 30B are alternately arranged in different positions in the Z-direction. Therefore, the six terminals 12A, 22A, 32A, 12B, 22B, and 32B are arranged with narrow spaces between them (i.e., the terminals). The six flux concentration cores 10A, 20A, 30A, 10B, 20B, and 30B are arranged on the back surface side of the terminal block 98. No other member is arranged between the six flux concentration cores 10A, 20A, 30A, 10B, 20B, and 30B and the back surface of the terminal block.

In FIG. 8, the gaps 14A, 24A, 34A, 14B, 24B, and 34B are formed in the flux concentration cores. A circuit board, not shown, to which the six magnetic sensors are fixed to the underside thereof covers of the six flux concentration cores 10A, 20A, 30A, 10B, 20B, and 30B from above. Thus, the magnetic sensors are fixed in a positional relationship in which they are inserted into corresponding gaps formed in the flux concentration cores.

The power conversion device is housed in a case 92. An opening 99 is formed in this case 92. The six bus bars, the six flux concentration cores, the six terminals, and the one terminal block are all housed in this case 92. The plurality of terminals 12A, 22A, 32A, 12B, 22B, and 32B that are fixed to the terminal block 98 face the opening 99 formed in the case 92.

A connector 100 that is connected to the terminals 12A, 22A, 32A, 12B, 22B, and 32B is able to be inserted inside of a wall 97 that surrounds the opening 99 of the case 92. When the connector 100 is inserted into the opening 99 from the outside, the connector and the terminals are connected. The connector 100 is provided with six bolts corresponding to the terminals 12A, 22A, 32A, 12B, 22B, and 32B. In FIG. 8, in order to make the drawing clearer, only a head portion 142c of one bolt is shown. When the connector 100 is inserted into the opening 99 from the outside, the connector 100 is placed in a positional relationship in which the axes of the bolts and the corresponding terminal holes 140 are aligned. Then when the bolts are tightened, the bolts 142 pass through the terminal holes 140 and screw into the terminal block 98. When the bolts 142 are screwed into the terminal block 98, an end portion 132A1 of a bus bar 132A on the connector 100 side closely contacts the terminal 32A, such that the bus bar 32A on the case side and the bus bar 132A on the connector side are electrically connected. The other end 132A2 of the bus bar 132A on the connector 100 side is connected to a three-phase motor. The foregoing description of the bolts and terminals is the same for the other bolts and terminals.

Heretofore, specific examples of the invention have been described in detail, but these are merely examples, and the invention is not limited to these examples. The invention also includes various modifications of the specific examples described above. Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

The invention claimed is:

1. A power conversion device comprising:
a plurality of bus bars including a first bus bar and a second bus bar that are adjacent to each other, and that extend parallel to each other;
a first flux concentration core that has a first end portion and a second end portion and encircles the first bus bar with the first end portion facing the second end portion across a first gap;
a second flux concentration core that has a first end portion and a second end portion and encircles the second bus bar with the first end portion facing the second end portion across a second gap;
a first magnetic sensor that is arranged in the first gap of the first flux concentration core;
a second magnetic sensor that is arranged in the second gap of the second flux concentration core;
a terminal block;
a case with an opening;
a connector;
power conversion semiconductor modules;
cooling panels for the power conversion semiconductor modules;
a coolant inlet pipe; and
a coolant outlet pipe,
wherein when viewed from a direction orthogonal to an extending direction of the bus bars, a position in the extending direction where the first flux concentration core is arranged is different than a position in the extending direction where the second flux concentration core is arranged,
when viewed from the extending direction of the bus bars, the first flux concentration core and the second flux concentration core partially overlap with each other,
the plurality of bus bars include a first bus bar group and a second bus bar group;
terminals of the bus bars in the first bus bar group and terminals of the bus bars in the second bus bar group are lined up and fixed to the terminal block;
the first flux concentration core is included in a first flux concentration core group;
the second flux concentration core is included in a second flux concentration core group;
the first flux concentration core group and the second flux concentration core group are arranged adjacent to the terminal block;
the first bus bar group, the second bus bar group, the first flux concentration core group, the second flux concentration core group, the terminals of the bus bars of the first bus bar group, the terminals of the bus bars of the second bus bar group, and the terminal block are housed within the case;
the terminals fixed to the terminal block face the opening;
the connector is fixed to the case when the connector is passed through the opening and connected to the terminals; and
the power conversion semiconductor modules are sandwiched between adjacent cooling panels for the power conversion semiconductor modules.

2. The power conversion device according to claim 1, wherein
the first gap and the second gap are arranged within the same plane;
the first magnetic sensor and the second magnetic sensor are mounted on a common circuit board;

the first magnetic sensor is arranged on the second flux concentration core side in the extending direction of the first bus bar in the first gap, when viewed from a direction orthogonal to the extending direction of the first bus bar and orthogonal to a width direction of the first bus bar; and the second magnetic sensor is arranged on the first flux concentration core side in the extending direction of the second bus bar in the second gap, when viewed from a direction orthogonal to the extending direction of the second bus bar and orthogonal to a width direction of the second bus bar.

3. The power conversion device according to claim 2, wherein the first magnetic sensor and the second magnetic sensor have the same specifications;

the first magnetic sensor includes a first magnetic sensory portion;

the second magnetic sensor includes a second magnetic sensory portion;

the first magnetic sensory portion is provided on the first flux concentration core side of the first magnetic sensor, when viewed from the direction orthogonal to the extending direction of the first bus bar and orthogonal to the width direction of the first bus bar; and the second magnetic sensory portion is provided on the second flux concentration core side of the second magnetic sensor, when viewed from the direction orthogonal to the extending direction of the second bus bar and orthogonal to the width direction of the second bus bar.

4. The power conversion device according to claim 1, further comprising a third flux concentration core, wherein the plurality of bus bars includes a third bus bar;

the third flux concentration core has a first end portion and a second end portion and encircles the third bus bar with the first end portion facing the second end portion across a third gap;

the first bus bar, the second bus bar and the third bus bar are arranged parallel to each other;

the second bus bar is provided between the first bus bar and the third bus bar;

a position of the first flux concentration core in the extending direction and a position of the third flux concentration core in the extending direction are equivalent, while a position of the second flux concentration core in the extending direction is offset with respect to the position of the first flux concentration core in the extending direction and the position of the third flux concentration core in the extending direction, when viewed from the direction orthogonal to the extending direction of the bus bars and orthogonal to the width direction of the bus bars; and the first flux concentration core and the second flux concentration core partially overlap with each other and the second flux concentration core and the third flux concentration core partially overlap with each other, when viewed from the extending direction of the bus bars.

5. The power conversion device according to claim 1, wherein the first bus bar group is a set of three bus bars for three-phase alternating current, and the second bus bar group is a set of three bus bars for three-phase alternating current; the six bus bars of the first bus bar group and the second bus bar group are arranged in line; the first bus bar group includes the first bus bar; and the second bus bar group includes the second bus bar.

* * * * *